(12) United States Patent
Chang et al.

(10) Patent No.: US 11,698,666 B2
(45) Date of Patent: Jul. 11, 2023

(54) BUCKLE BASE/FIXING PIN COMBINATION (71) Applicant: Quanta Computer Inc., Taoyuan (TW)

(72) Inventors: Chun Chang, Taoyuan (TW);
Kai-Yuan Chuang, Taoyuan (TW);
Wei-Pin Chen, Taoyuan (TW); Jyue Hou, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 125 days.

(21) Appl. No.: 17/303,978

(22) Filed: Jun. 11, 2021

(65) Prior Publication Data

US 2022/0397945 A1    Dec. 15, 2022

(51) Int. Cl.
*G06F 1/18* (2006.01)
*H05K 7/14* (2006.01)

(52) U.S. Cl.
CPC .......... *G06F 1/185* (2013.01); *H05K 7/1427* (2013.01)

(58) Field of Classification Search
CPC ....... G06F 1/185; G06F 1/186; H05K 7/1402; H05K 7/1409; H05K 7/1427; H05K 7/1408; H05K 7/1405; H05K 7/1404
See application file for complete search history.

(56) References Cited

U.S. PATENT DOCUMENTS

| | | | |
|---|---|---|---|
| 7,134,896 B1 * | 11/2006 | Chen | H05K 7/1404 439/326 |
| 9,952,634 B2 * | 4/2018 | Samper | G06F 1/16 |
| 2005/0285375 A1 * | 12/2005 | Kawai | B60R 21/215 280/730.2 |
| 2014/0321081 A1 * | 10/2014 | Sun | H05K 7/1417 361/753 |

* cited by examiner

*Primary Examiner* — James Wu
(74) *Attorney, Agent, or Firm* — Nixon Peabody LLP (57) ABSTRACT

A buckle base and buckle-fixing pin combination to be used in fixing a printed circuit board to a sheet includes a buckle base and a buckle-fixing pin. The buckle base is in a generally U-shaped form. The buckle base includes a first leg, a second leg, and a bridge therebetween. The first and second legs are connected to the bridge. The buckle-fixing pin forms a longitudinal slot therein.

20 Claims, 12 Drawing Sheets

BUCKLE BASE/FIXING PIN COMBINATION

FIELD OF THE INVENTION

The present invention relates generally to a buckle base/fixing pin combination for fixing a printed circuit board assembly to a sheet, and more specifically, to a buckle base/fixing pin combination for fixing a printed circuit board assembly to a sheet such as a chassis or a motherboard tray.

BACKGROUND OF THE INVENTION

In today's server applications, the printed circuit board assembly is one of its most important components. The printed circuit board assembly in such applications needs to be fixed to a sheet, such as to a chassis or a motherboard tray. This is typically done using a fastener, such as a screw. This method has disadvantages in that a user can lose or mishandle the screws when originally fixing the printed circuit board assembly or when performing maintenance on the printed circuit board assembly. By not properly fixing the printed circuit board assembly, damage may be caused to the server, especially during transportation of the server.

In an attempt to address this problem, one solution is using thumb screws to fasten the printed circuit board assembly to the chassis or the motherboard tray. This solution, however, is costly.

It would be desirable to have a component and a method for fixing a printed circuit board assembly to a sheet, such as a chassis or a motherboard tray, in an efficient and less costly manner.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to one aspect of the present disclosure, a buckle base and buckle-fixing pin combination to be used in fixing a printed circuit board to a sheet includes a buckle base and a buckle-fixing pin. The buckle base is in a generally U-shaped form. The buckle base includes a first leg, a second leg, and a bridge therebetween. The first and second legs are connected to the bridge. The buckle-fixing pin forms a longitudinal slot therein.

According to a configuration of the above implementation, each of the first and second legs of the buckle base has an interior surface and an exterior surface. At least one of the interior surfaces of the first and second legs includes a knob extending therefrom. In one configuration, each of the interior surfaces of the first and the second legs includes a knob extending therefrom. The knob may be a generally semi-circular form in one embodiment.

According to another configuration of the above implementation, the longitudinal slot formed in the buckle-fixing pin widens at an end thereof.

In another implementation, the buckle-fixing pin includes a first section and a second section connected by a link.

In yet another implementation, the buckle base and the buckle-fixing pin are separate components.

In a further implementation, the buckle base and the buckle-fixing pin are connected by a tether. In another implementation, the buckle base and the buckle-fixing pin are pivotably connected.

In a further implementation, the buckle base and the buckle-fixing pin comprise polymeric materials. Non-limiting examples of polymeric materials include polycarbonate, and mixtures of polycarbonate and acrylonitrile butadiene styrene (ABS).

According to another aspect of the present disclosure, a method of fixing a printed circuit board assembly to a sheet includes providing the printed circuit board assembly. The printed circuit board assembly forms an aperture therein. The aperture has a first end and a second end. The first end has a width less than a width of the second end of the aperture. A buckle base and buckle-fixing pin combination is provided. The buckle base is in a generally U-shaped form. The buckle base includes a first leg, a second leg, and a bridge therebetween. The first and second legs are connected to the bridge. The buckle base is placed in the second end of the aperture of the printed circuit board assembly. The sheet including a hook extending therefrom is provided. The hook of the sheet is placed into the first end of the aperture of the printed circuit board assembly. The buckle-fixing pin is inserted between the hook and the buckle base into the aperture of the printed circuit board assembly so as to fix the printed circuit board assembly to the sheet.

In a further aspect of the above implementation, the aperture of the printed circuit board assembly is in the form of a bottle.

In a further implementation, the sheet is metal.

In yet another implementation, each of the first and second legs of the buckle base has an interior surface and an exterior surface. Each of the interior surfaces of the first and second legs includes a knob extending therefrom.

In a further implementation, the longitudinal slot formed in the buckle-fixing pin widens at an end thereof.

In yet another implementation, the buckle base and the buckle-fixing pin are separate components.

In a further implementation, the buckle base and the buckle-fixing pin are connected by a tether.

In yet another implementation, the buckle base and the buckle-fixing pin are pivotably connected.

In a further implementation, the buckle base and the buckle-fixing pin comprise polymeric materials.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

According to one aspect of the present disclosure, a buckle base and buckle-fixing pin combination to be used in fixing a printed circuit board assembly to a sheet includes a buckle base and a buckle-fixing pin. The buckle base is in a generally U-shaped form. The buckle base includes a first leg, a second leg, and a bridge therebetween. The first and second legs are connected to the bridge. The buckle-fixing pin forms a longitudinal slot therein.

The buckle base and buckle-fixing pin combination in one method is used to fix a printed circuit board assembly to a sheet. The sheet may be in the form of a chassis or a motherboard tray. The method of fixing a printed circuit board assembly to a sheet via the buckle base and the buckle-fixing pin combination can be accomplished in a cost efficient manner. The method can also be accomplished in a toolless manner, if desired.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 1A:
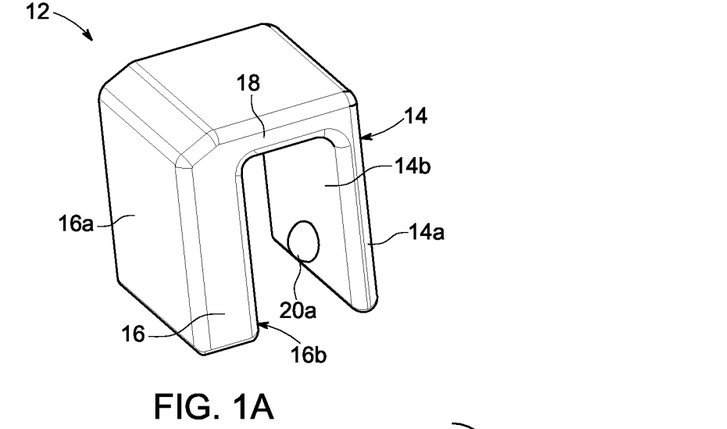
FIG. 1A is a front perspective view of a buckle base, in accordance with one embodiment of the present disclosure.
Figure 1B:
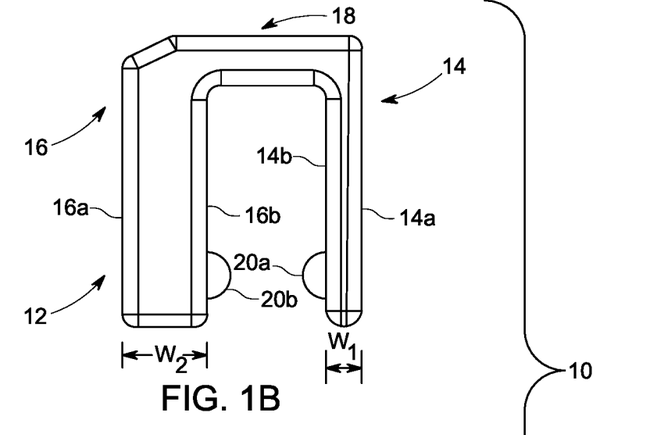
FIG. 1B is a front view of the buckle base of FIG. 1A.
Figure 1C:
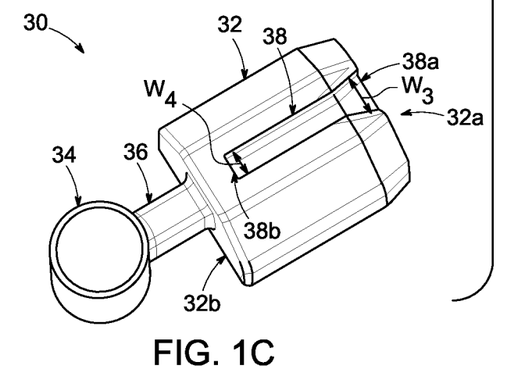
FIG. 1C is a top perspective view of a buckle-fixing pin, in accordance with one embodiment of the present disclosure.

Referring to FIGS. 1A-1C, components for a buckle base and buckle-fixing pin combination are depicted according to one embodiment. The buckle base and buckle-fixing pin combination 10 includes a buckle base 12 (FIGS. 1A and 1B) and a buckle-fixing pin 30 (FIG. 1C) according to one embodiment.

Referring to FIGS. 1A, 1B the buckle base 12 is in a generally U-shaped form. The buckle base 12 includes a first leg 14 and a second leg 16, and a bridge 18 therebetween. The first and second legs 14, 16 are connected to the bridge 18. In one embodiment, the first and second legs 14, 16 are integrally connected to the bridge 18. The bridge 18 has a chamfered edge before being connected to the second leg 16. It is contemplated that components of a buckle base may be formed separately and attached with each other.

The first leg 14 includes an exterior surface 14a and an interior surface 14b. Similarly, the second leg 16 includes an exterior surface 16a and an interior surface 16b. As shown in FIG. 1B, a width W1 of the first leg 14 is smaller than a width W2 of the second leg 16. If the buckle base 12 is fixed using a screw, for example, it may be desirable to have one of the legs of a great width. It is contemplated that the widths of the first leg and the second leg may generally be similar or even identical.

As best shown in FIG. 1B, the interior surface 14b of the first leg 14 includes a knob 20a extending therefrom, while the interior surface 16b of the second leg 16 includes a knob 20b extending therefrom. The knobs 20a, 20b are shaped and sized to securely position the buckle base 12 on a printed circuit board assembly, as will be discussed below. Each of the knobs 20a, 20b is in a generally semi-circular form in one embodiment. It is contemplated that the knobs may be shaped and sized differently than depicted in FIGS. 1A, 1B.

In another embodiment, at least one of the first and second legs of the buckle base includes a knob. Thus, it is contemplated that the first and second legs, in one embodiment, includes exactly one knob to assist in securely positioning the buckle base on a printed circuit board assembly.

In another non-limiting embodiment, a buckle base to be used in a buckle base and buckle-fixing pin combination may be formed in the absence of the knobs. In this embodiment, the buckle base may be fixed to a printed circuit board assembly via a fastener, such as a screw or the like. Some examples of screws include, but are not limited to, plunger screws or captive screws. It is contemplated that other fasteners may be used to fasten the buckle bas to the printed circuit board assembly.

Referring back to FIG. 1C, the buckle-fixing pin 30 is depicted according to one embodiment. The buckle-fixing pin 30 includes a first section 32 and a second section 34 connected by a link 36. In one embodiment, the first section 32, the second section 34, and the link 36 are integrally formed with each other. It is contemplated that the first section, the second section, and the link of the buckle-fixing pin may be separately formed and attached thereafter, in another embodiment.

Figure 6:
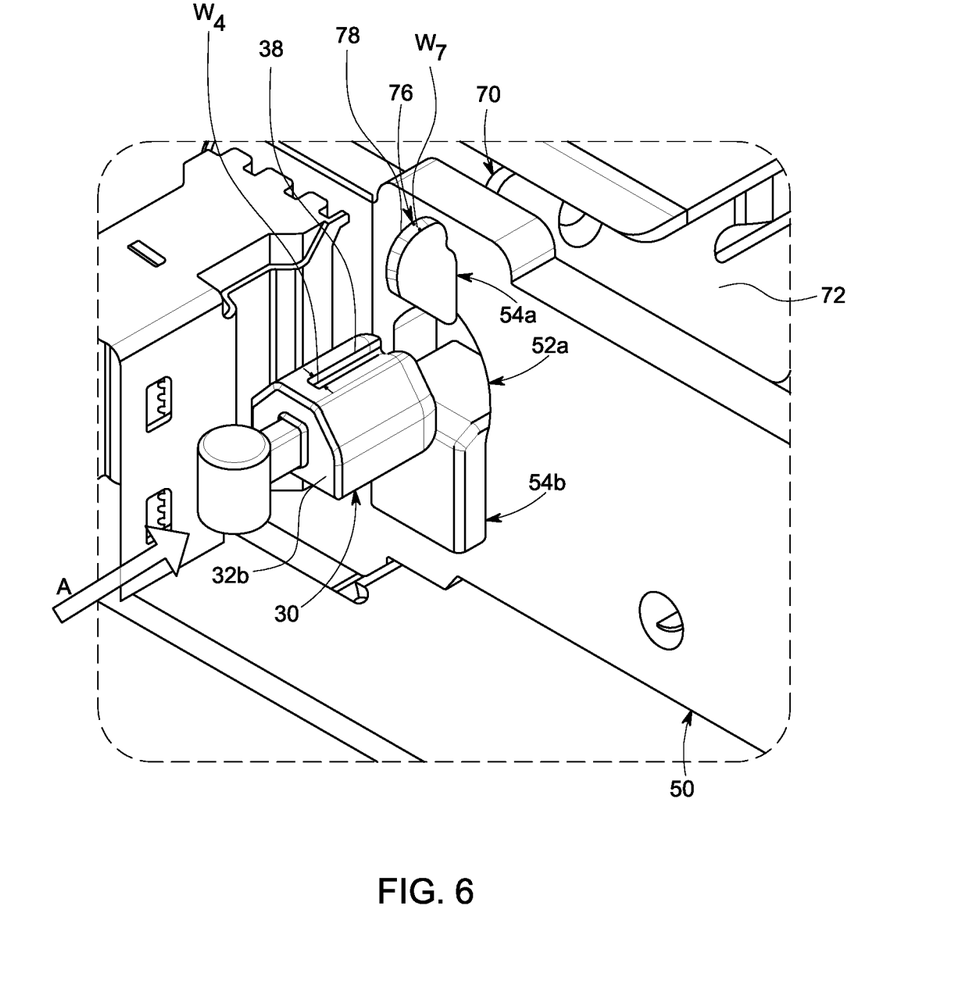
FIG. 6 is an enlarged view of a portion of FIG. 5 further showing the buckle-fixing pin of FIG. 1C being inserted, in accordance with one method of the present disclosure.

The first section 32 has a first end 32a and a second end 32b. The first and second ends 32a, 32b are shaped and sized to correspond with an aperture in a printed circuit board assembly, as will be discussed below. Each of the first and second ends 32a, 32b has a cross-sectional of generally polygonal shape. The second end 32b has a cross-sectional of a generally polygonal shape with 6 sides as best shown in FIG. 6. This is in the shape of a decagon that has been divided or split apart evenly. The first end 32a of the first section is the same general cross-sectional shape as the second end 32b. It is contemplated that the first and second ends of the first section may be shaped and sized differently in other embodiments, although typically they are the same or substantially the same.

The first section 32 of the buckle-fixing pin 30 forms a longitudinal slot 38 therein. As will be discussed in more detail below, the longitudinal slot 38 formed in the buckle-fixing pin 30 assists in securing a printed circuit board assembly to a sheet, as will be discussed below. The longitudinal slot 38 has a first end 38a and a second end 38b. The second end 38b of the longitudinal slot 38 is spaced apart from the second end 32b of the first section 32 in one embodiment. The first end 38a of the longitudinal slot 38 widens or flares outwardly as compared to the second end 38b of the longitudinal slot 38. Thus, a width W3 of the first end 38a is greater than a width W4 of the second end 38b. The first end 38a being flared assists in positioning the buckle-fixing pin 30, as will be discussed below. The second section 34 of the buckle-fixing pin 30 is generally cylindrical shaped. This is advantageous in that the buckle-fixing pin 30 is small and the cylindrical shaped design is easy to pinch.

It is contemplated that the first and second sections of the buckle-fixing pin may be sized and shaped differently than depicted in FIG. 1C.

As shown in FIGS. 1A-1C, the buckle base and buckle-fixing pin combination 10, including the buckle base 12 and the buckle-fixing pin 30, are separate components. In other embodiments that will be discussed below, the buckle base and buckle-fixing pin combination are not separated, but rather are connected.

Figure 2A:
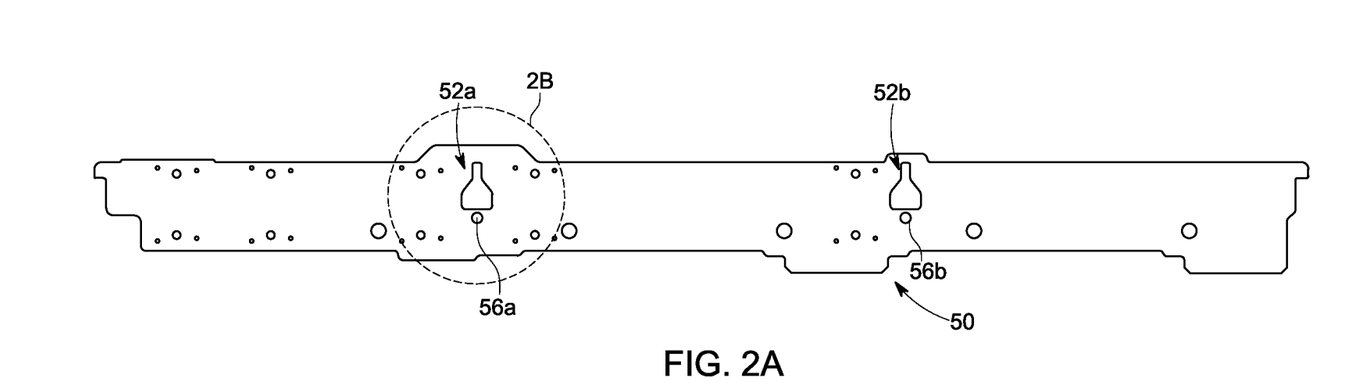
FIG. 2A is a side view of a printed circuit board assembly with a plurality of apertures formed therein, in accordance with one embodiment of the present disclosure.
Figure 2B:
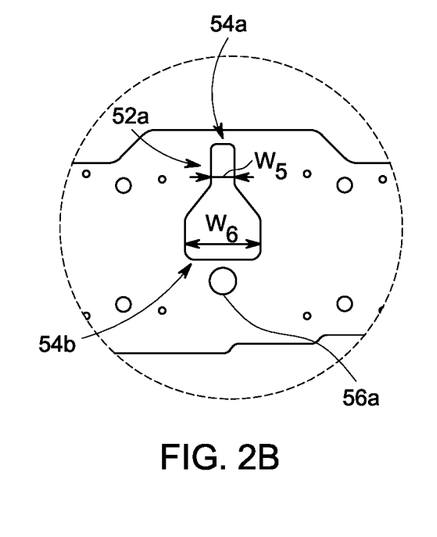
FIG. 2B is an enlarged view of area 2B in FIGS. 2A, 2B.
Figure 3:
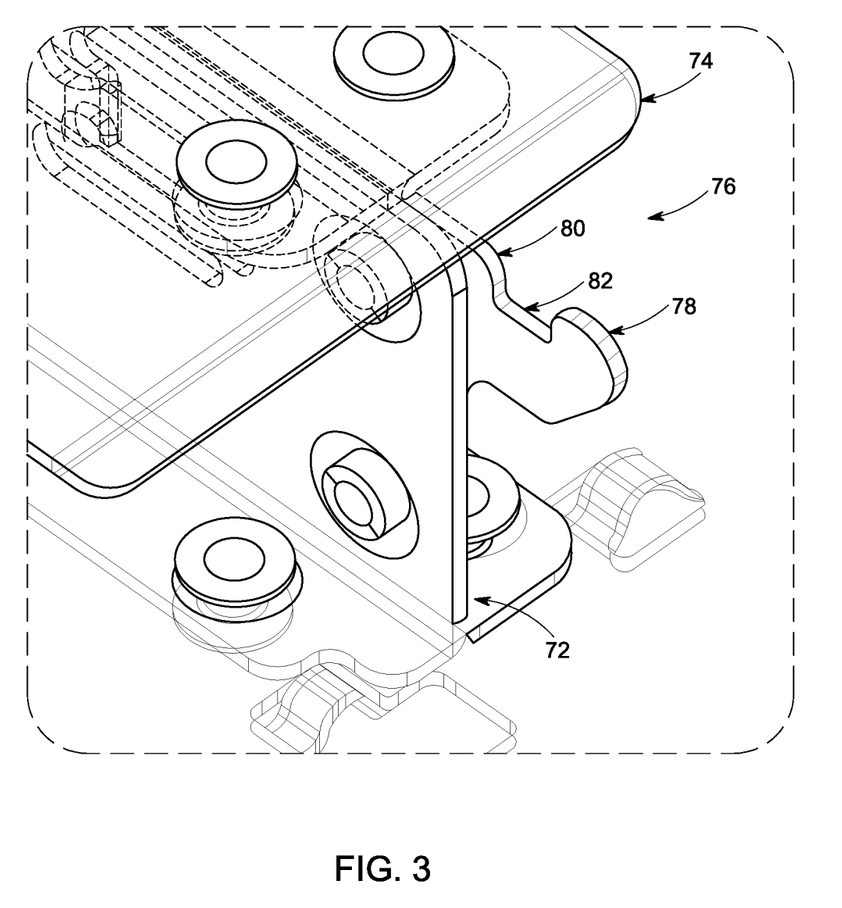
FIG. 3 is a perspective view of a sheet with a hook, in accordance with one embodiment of the present disclosure.

Before discussing a method of fixing a printed circuit board assembly to a sheet using a buckle base and buckle-fixing pin combination, the printed circuit board assembly and the sheet will be first discussed. FIGS. 2A and 2B depict a printed circuit board assembly 50, and FIG. 3 depicts a sheet 70.

Referring initially to FIGS. 2A and 2B, the printed circuit board assembly 50 is depicted. The printed circuit board assembly 50 forms apertures 52a, 52b that are configured to receive, inter alia, a buckle base and buckle-fixing pin combination (e.g., the buckle base and buckle-fixing pin combination 10), as will be discussed below. The aperture 52a of FIG. 2A has been enlarged and is shown in FIG. 2B. The aperture 52a of FIG. 2B includes a first end 54a and a second end 54b. The first end 54a has a width W5 and the second end 54b has a width W6. The width W5 of the first end 54a is smaller than the width W6 of the second end 54b. The aperture 52a, as well as the aperture 52b, are sized and shaped to receive the buckle base and buckle-fixing pin combination 10 and a portion (hook 76) of the sheet 70, as will be discussed below. The apertures 52a, 52b are in the general shape of a bottle with the first end 54a shaped as a neck and the second end 54b shaped as a widened base.

The printed circuit board assembly 50 further includes openings 56a, 56b. Each of openings 56a, 56b is located beneath and generally aligned with the apertures 52a, 52b, respectively. The openings 56a, 56b of FIG. 2A are generally circular shaped.

The openings 56a, 56b are configured to receive a knob on each side to assist in securing a buckle base. For example, the openings 56a, 56b are configured to receive a respective knob 20a, 20b of the buckle base 12 to assist in securing the buckle base 12 to the printed circuit board assembly 50.

The printed circuit board assembly may be used in a hard disk drive (HDD), a power development board (PDB) or a motherboard (MB). It is contemplated that the printed circuit board assembly may be used in other implementations.

Referring to FIG. 3, a perspective view of a sheet 70 is shown. The sheet may be a chassis in one embodiment. The sheet in another embodiment may be a motherboard tray. It is contemplated that the sheet may be in other forms than a chassis or a motherboard tray, such as an HDD cage, or a riser card bracket (e.g., a PCLe riser BD bracket).

The sheet 70 includes a partition 72 and a top cover 74. The partition 72 includes or forms a hook 76 extending therefrom. The hook 76 extends upwardly from the partition 72. The hook 76 includes a first end 78 and a second end 80 with a notch 82 formed therebetween. The hook 76 is configured to be received in one of the apertures 52a, 52b of the printed circuit board assembly 50 shown in FIGS. 2A, 2B. For example, the hook 76 is configured to be received in the first end 54a of the aperture 52a of the printed circuit board assembly 50.

Figure 4:
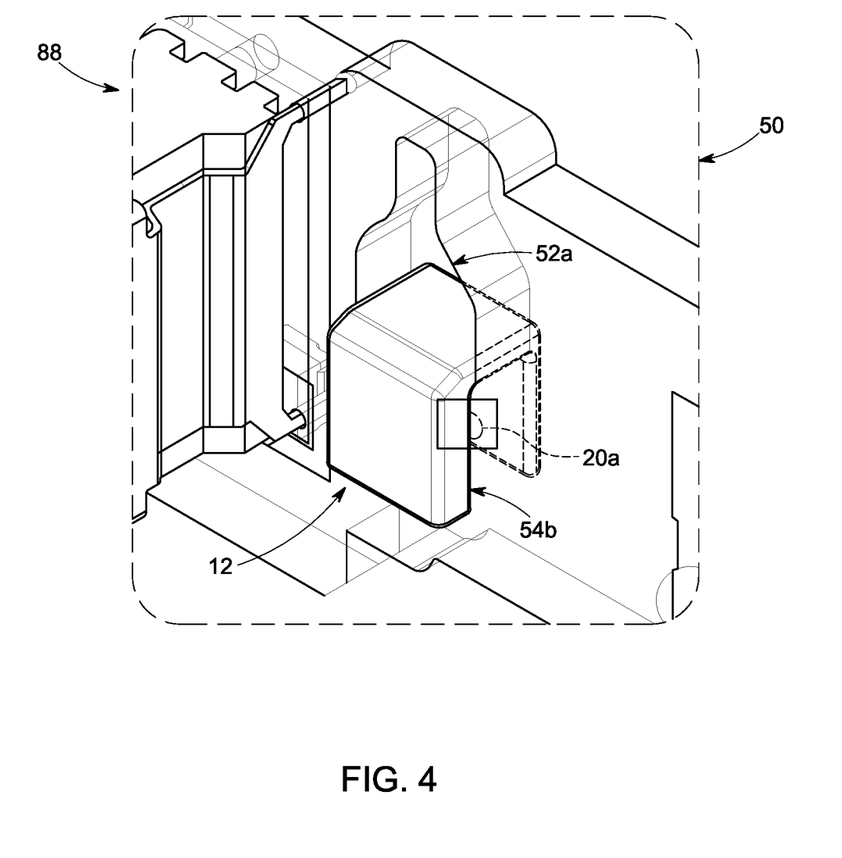
FIG. 4 is a generally front perspective view of the buckle base of FIGS. 1A, 1B placed on the printed circuit board assembly of FIGS. 2A, 2B.

Referring to FIGS. 4-7, a non-limiting method of fixing the printed circuit board assembly 50 to the sheet 70 using the buckle base and buckle-fixing pin combination 10 is shown. This method may be performed in the absence of tools. Referring to FIG. 4, the buckle base 12 is shown as being installed or placed into the aperture 52a of the printed circuit board assembly 50 such that the bridge 18 rests on the surface of the aperture 52a at the second end 54b, and the first and second legs 14, 16 hang on either side of the aperture 52a. As shown best in FIG. 7, the knobs 20a, 20b of the buckle base 12 extend into the opening 56a formed in the printed circuit board assembly 50 (see FIGS. 2A, 2B). FIG. 4 also depicts a data transfer connector 88.

Figure 5:
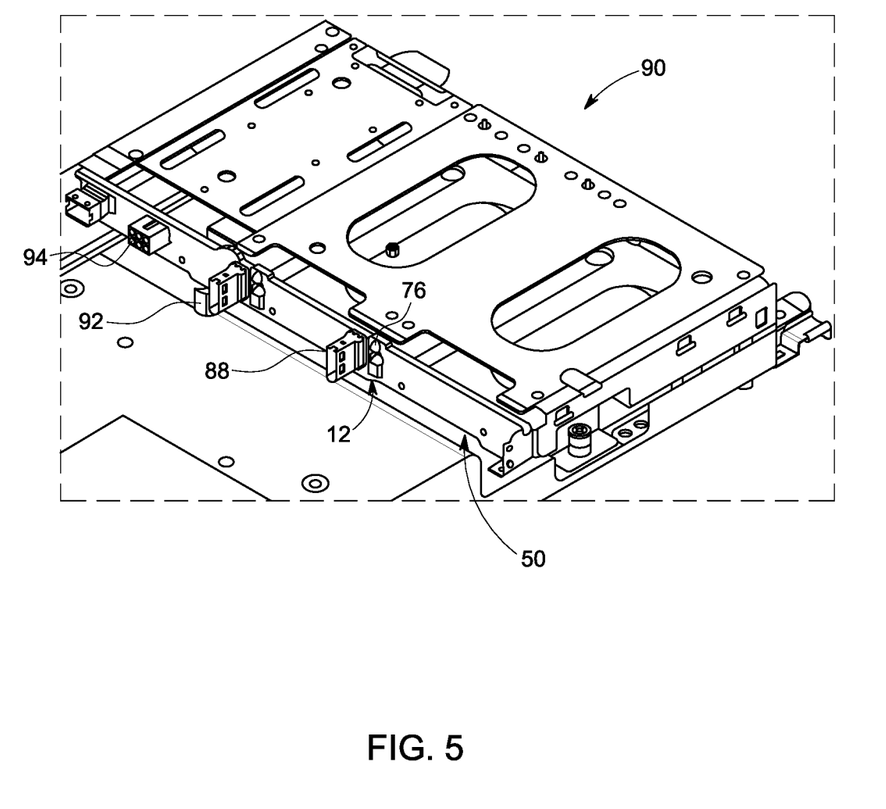
FIG. 5 is a generally top perspective view of the sheet of FIG. 3 with the printed circuit board assembly of FIGS. 2A, 2B, including the buckle base of FIGS. 1A, 1B.

Referring to FIGS. 5 and 6, the hook 76 of the sheet 70 is shown as extending through the aperture 52*a* after the buckle base 12 has been located in the aperture 52*a* of the printed circuit board assembly 50. More specifically, the first end 78 of the hook 76 extends through the first end 54*a* of the aperture 52*a* of the printed circuit board assembly 50. FIG. 5 also depicts the data transfer connector 88, a cage 90, a signal connector 92, and a power connector 94.

Referring specifically to FIG. 6, the buckle-fixing pin 30 is shown in the process of being inserted into the aperture 52*a*. Specifically, the buckle-fixing pin 30 is shown moving in the general direction of arrow A into a portion of the aperture 52*a* between the buckle base 12 and the hook 76. The longitudinal slot 38 formed in the buckle-fixing pin 30 is aligned with the bottom end of the hook 76. Thus, the longitudinal slot 38 is configured in size and shape to receive the bottom end of the hook 76. Specifically, the width W4 of the longitudinal slot 38 is slightly wider than a width W7 of the bottom end of the hook 76. The longitudinal slot 38 of the buckle-fixing pin 30 assists in quickly positioning and securing the buckle-fixing pin 30 into the aperture 52*a* of the printed circuit board assembly 50.

Figure 7:
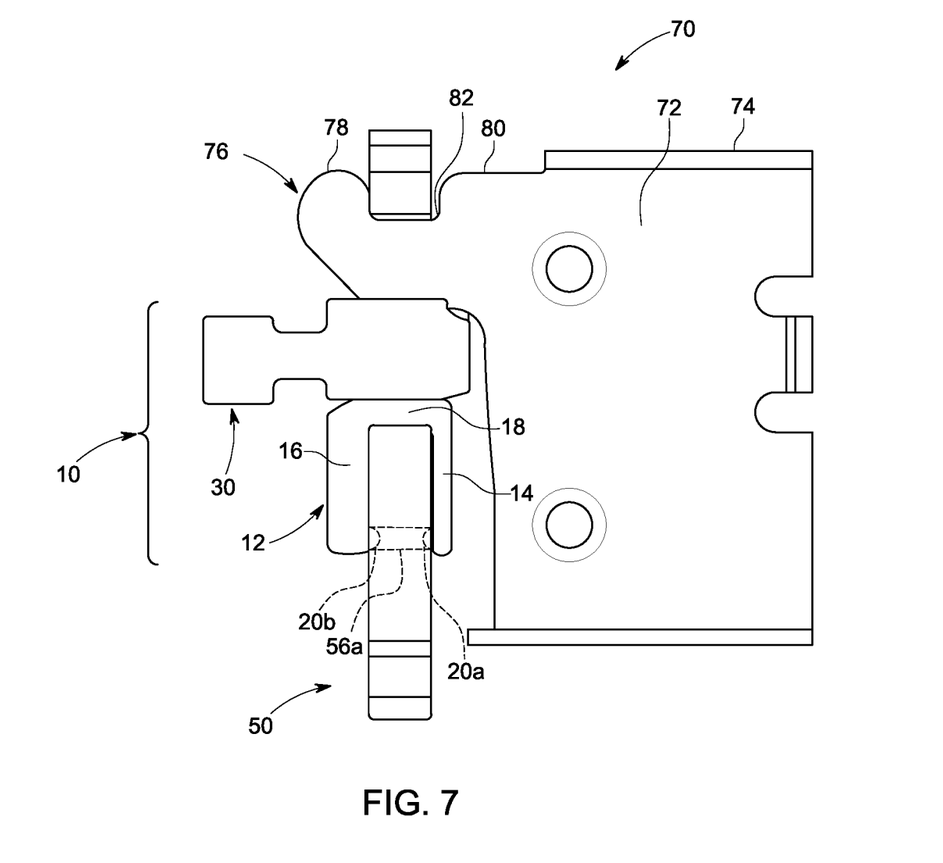
FIG. 7 is a cross-sectional side view of FIG. 6 after the buckle-fixing pin of FIG. 1C has been inserted, in accordance with one method of the present disclosure.

FIG. 7 shows a cross-sectional side view of the printed circuit board assembly 50 being fixed to the sheet 70 using the buckle base and buckle-fixing pin combination 10 (the buckle base 12 and the buckle-fixing pin 30).

It is contemplated that fixing the printed circuit board assembly 50 to the sheet 70 may be performed in a different sequence than the sequence shown and described with respect to FIGS. 4-7. For example, it is contemplated that the extending hook 76 may extend through the aperture 52*a* of the printed circuit board assembly 50 before the buckle base 12 is placed into the aperture 52*a*.

It is contemplated that the buckle base and buckle-fixing pin combination may be different than described above with respect to the buckle base and buckle-fixing pin combination 10.

Figure 8:
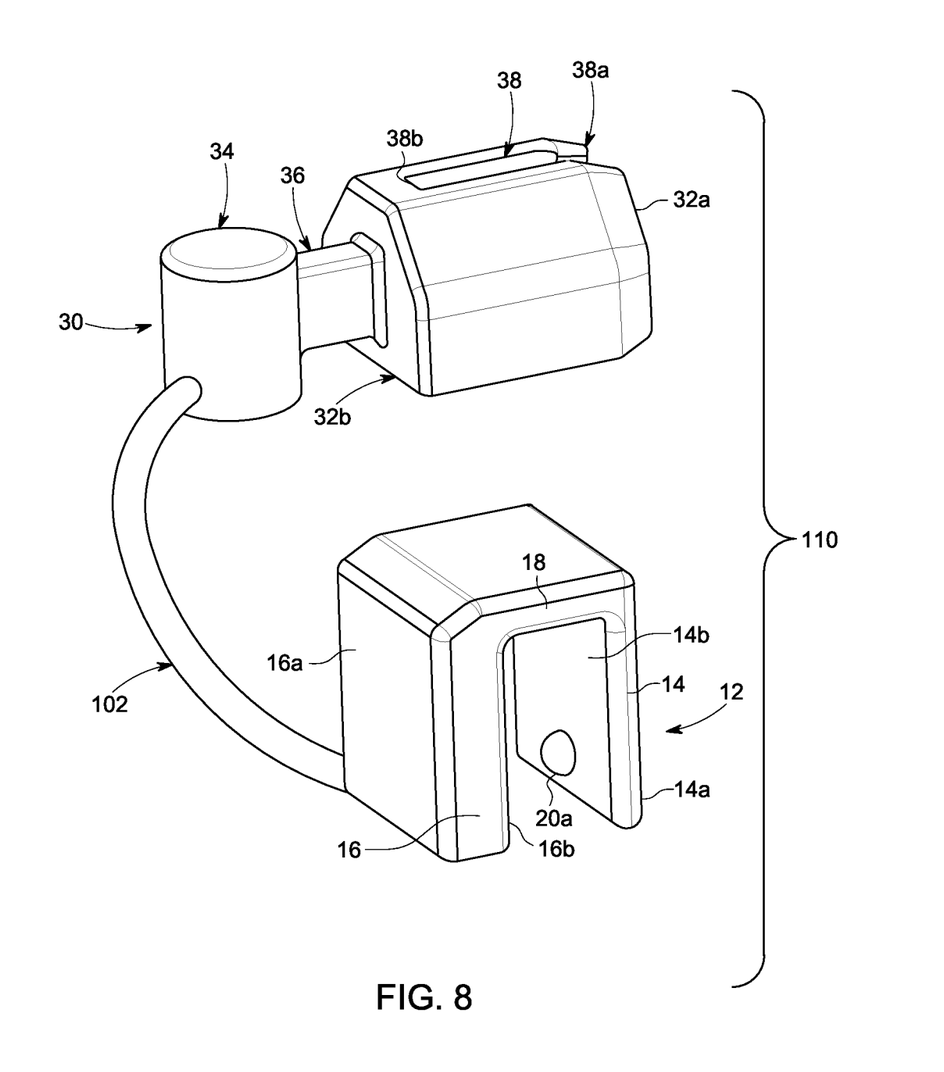
FIG. 8 is a front perspective view of a buckle base and a buckle-fixing pin combination, in accordance with another embodiment of the present disclosure.

In another non-limiting embodiment shown in FIG. 8, a buckle base and buckle-fixing pin combination 110 includes the buckle base 12, the buckle-fixing pin 30, and a tether 102. The tether 102 is a flexible arm that connects to the buckle base 12 and the buckle-fixing pin 30. The tether 102 allows the buckle-fixing pin 30 to be moved freely with respect to the buckle base 12, while still being attached. The tether 102 is made of a flexible material and sized properly to allow such movement. The tether may be made of a polymeric material. Non-limiting polymeric examples for forming tether include, but are not limited to, polycarbonate, and mixtures of polycarbonate and acrylonitrile butadiene styrene (ABS). It is contemplated that the tether may be made of other polymeric materials, or non-polymeric materials.

Figure 9:
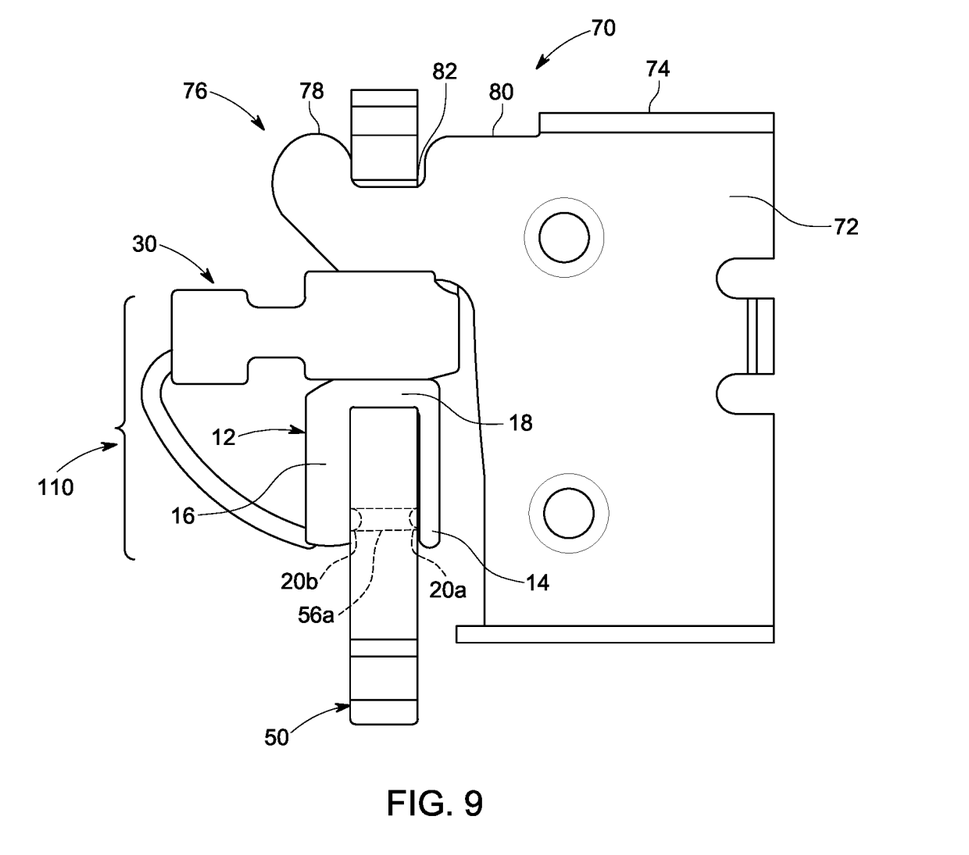
FIG. 9 is a cross-sectional side view of the sheet of FIG. 3, the printed circuit board assembly of FIGS. 2A, 2B and the buckle base and buckle-fixing pin combination of FIG. 8.

FIG. 9 shows a cross-sectional side view of the printed circuit board assembly 50 being fixed to the sheet 70 using the buckle base and buckle-fixing pin combination 110 (the buckle base 10, the buckle-fixing pin 30, and the tether 102).

Figure 10A:
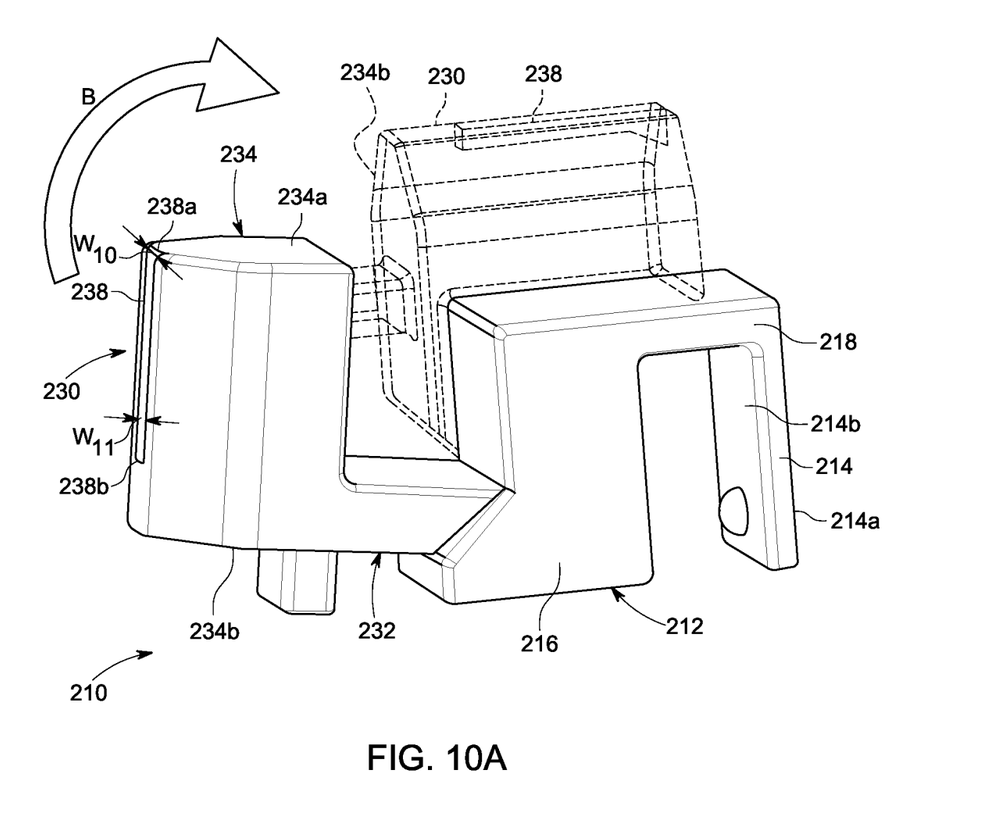
FIG. 10A is a front perspective view of a buckle base and a buckle-fixing pin combination, in accordance with a further embodiment of the present disclosure.
Figure 10B:
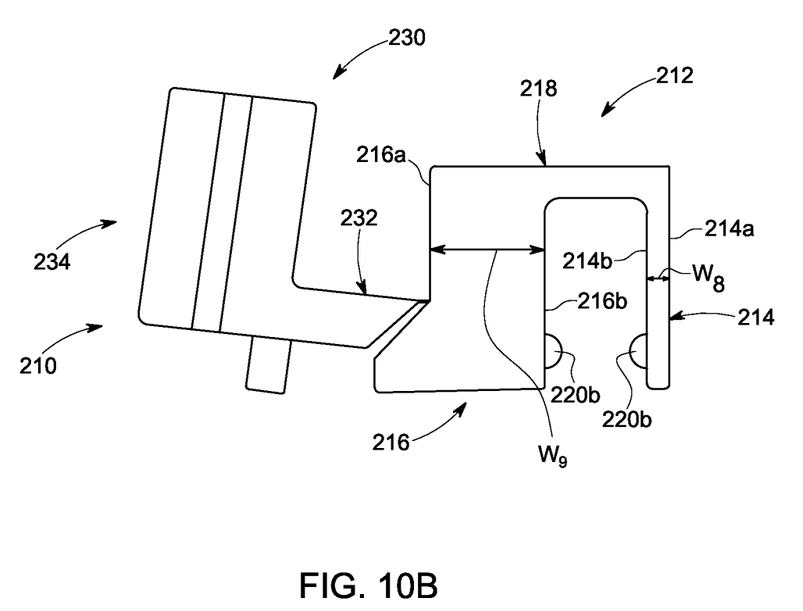
FIG. 10B is a front view of the buckle base and buckle-fixing pin combination of FIG. 10A.

FIGS. 10A and 10B illustrate a further embodiment of a buckle base and buckle-fixing pin combination. Specifically, FIGS. 10A and 10B illustrate a buckle base and buckle-fixing pin combination 210 that includes a buckle base 212, and a buckle-fixing pin 230. The buckle-fixing pin 230 is pivotably connected to the buckle base 212. The buckle-fixing pin 230 includes a pivotable arm 232 that assists in moving the buckle-fixing pin 230 relative to the buckle base 212. Two different positions of the buckle-fixing pin 230 are shown in FIG. 10A. The first position shows the buckle-fixing pin 230 in solid lines. After the buckle-fixing pin 230 is moved along arrow B to a second position, the buckle-fixing pin 230 is shown in dashed lines.

Referring to FIGS. 10A, 10B, the buckle base 212 is in a generally U-shaped form. The buckle base 212 includes a first leg 214, a second leg 216, and a bridge 218 therebetween. The first and second legs 214, 216 are connected to the bridge 218. In one embodiment, the first and second legs 214, 216 are integrally connected to the bridge 218. It is contemplated that components of the buckle base may be formed separately and attached with each other.

The first leg 214 includes an exterior surface 214*a* and an interior surface 214*b*. Similarly, the second leg 216 includes an exterior surface 216*a* and an interior surface 216*b*. As best shown in FIG. 10B, a width W8 of the first leg 214 is much smaller than a width W9 of the second leg 216.

As best shown in FIG. 10B, the interior surface 214*b* of the first leg 214 includes a knob 220*a* extending therefrom, while the interior surface 216*b* of the second leg 216 includes a knob 220*b* extending therefrom. The knobs 220*a*, 220*b* are shaped and sized to securely position the buckle base 212 on a printed circuit board assembly (e.g., the printed circuit board assembly 50). Each of the knobs 220*a*, 220*b* is in a generally semi-circular form in one embodiment. It is contemplated that the knobs may be shaped and sized differently than depicted in FIGS. 10A, 10B.

In another embodiment, at least one of the first and second legs of the buckle base includes a knob. Thus, it is contemplated that the first and second legs, in one embodiment, includes exactly one knob to assist in securely positioning the buckle base on a printed circuit board assembly.

In another non-limiting embodiment, a buckle base to be used in a buckle base and buckle-fixing pin combination may be formed in the absence of the knobs. In this embodiment, the buckle base may be fixed to a printed circuit board assembly via a fastener, such as a screw or the like. Some examples of screws include, but are not limited to, plunger screws or captive screws. It is contemplated that other fasteners may be used to fasten the buckle bas to the printed circuit board assembly.

Referring to FIG. 10B, the buckle-fixing pin 230 includes the pivotable arm 232 connected to a section 234. In one embodiment, the pivotable arm 232 and the section 234 are integrally connected. It is contemplated that an arm and a section of the buckle-fixing pin may be separately formed and attached in another embodiment.

The section 234 is shaped and sized to correspond with an aperture formed in a printed circuit board assembly. In the non-limiting example shown in FIG. 10A-10B, the section 234 has a generally polygonal-shaped cross-section with six sides, as best shown in FIG. 10A in dashed lines. The section 234 has a first end 234*a* and a second end 234*b*. It is contemplated that the section may be shaped and sized differently in other embodiments.

The section 234 of the buckle-fixing pin 230 forms a longitudinal slot 238 therein. The longitudinal slot 238 assists the buckle-fixing pin 230 in securing a printed circuit board assembly to a sheet, as will be discussed below with respect to FIG. 11. The longitudinal slot 238 of FIG. 10A has a first end 238*a* and a second end 238*b*. The second end 238*b* of the longitudinal slot 238 is spaced from the second end 234*b* in one embodiment. The first end 238*a* of the longitudinal slot 238 widen or flares outwardly as compared to the second end 238*b* of the longitudinal slot 238. Thus, a width W10 of the longitudinal slot 238 at the first end 238a is greater than a width W11 of the longitudinal slot 238 at the second end 238b.

It is contemplated that the section of the buckle-fixing pin may be sized and shaped differently than depicted in FIGS. 10A, 10B.

Figure 11:
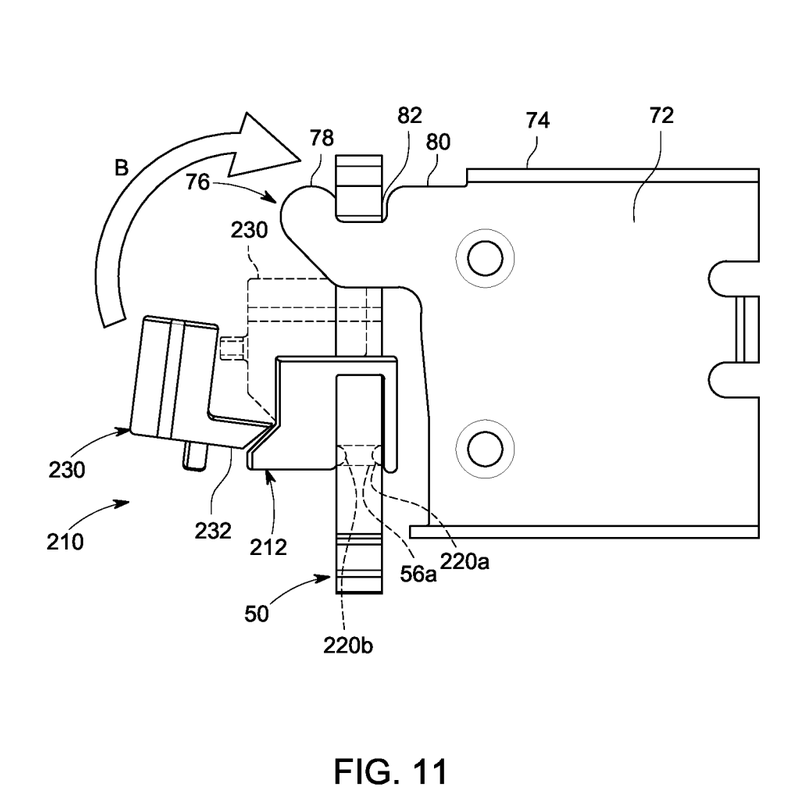
FIG. 11 is a cross-sectional side view of the sheet of FIG. 3, the printed circuit board assembly of FIGS. 2A, 2B, and the buckle base and the buckle-fixing pin combination of FIGS. 10A, 10B.

FIG. 11 shows a cross-sectional side view of the printed circuit board assembly 50 being fixed to the metal sheet 70 using the buckle base and buckle-fixing pin combination 210. Like in FIG. 10A, the buckle base and buckle-fixing pin combination 210 shows the buckle-fixing pin 230 being in a first position (solid lines) and being moved along the arrow B to a second position (shown in dashed lines)

The buckle base and buckle-fixing pin combinations of the present invention comprise polymeric material. Examples of polymeric material that may be used in forming the buckle base and buckle-fixing pin combinations include, but are not limited to, polycarbonate, and mixtures of polycarbonate and acrylonitrile butadiene styrene (ABS). It is contemplated that buckle base and buckle-fixing pin combinations may be made of other polymeric materials, or non-polymeric materials.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A buckle base and buckle-fixing pin combination to be used in fixing a printed circuit board to a sheet, the buckle base and buckle-fixing pin combination comprising:
   a buckle base in a generally U-shaped form, the buckle base including a first leg, a second leg, and a bridge therebetween, the first and second legs connected to the bridge; and
   a buckle-fixing pin, the buckle-fixing pin forming a longitudinal slot therein,
   wherein a contacting surface of the buckle-fixing pin is configured to be placed on a surface of the buckle base in which the longitudinal slot of the buckle-fixing pin is located opposite of the contacting surface of the buckle-fixing pin, and
   wherein the longitudinal slot is configured to receive a hook of the sheet in an aperture of the printed circuit board.

2. The buckle base and buckle-fixing pin combination of claim 1, wherein each of the first and second legs of the buckle base has an interior surface and an exterior surface, at least one of the interior surfaces of the first and second legs including a knob extending therefrom.

3. The buckle base and buckle-fixing pin combination of claim 2, wherein each of the interior surfaces of the first and the second legs includes a knob extending therefrom.

4. The buckle base and buckle-fixing pin combination of claim 3, wherein the knob is in a generally semi-circular form.

5. The buckle base and buckle-fixing pin combination of claim 1, wherein the longitudinal slot formed in the buckle-fixing pin widens at an end thereof.

6. The buckle base and buckle-fixing pin combination of claim 1, wherein the buckle-fixing pin includes a first section and a second section connected by a link.

7. The buckle base and buckle-fixing pin combination of claim 1, wherein the buckle base and the buckle-fixing pin are separate components.

8. The buckle base and buckle-fixing pin combination of claim 1, wherein the buckle base and the buckle-fixing pin are connected by a tether.

9. The buckle base and buckle-fixing pin combination of claim 1, wherein the buckle base and the buckle-fixing pin are pivotably connected.

10. The buckle base and buckle-fixing pin combination of claim 1, wherein the buckle base and the buckle-fixing pin comprise polymeric materials.

11. The buckle base and buckle-fixing pin combination of claim 10, wherein the buckle base and the buckle-fixing pin combination comprise polycarbonate, or mixtures of polycarbonate and acrylonitrile butadiene styrene (ABS).

12. A method of fixing a printed circuit board assembly to a sheet, the method comprising:
    providing the printed circuit board assembly, the printed circuit board assembly forming an aperture therein, the aperture having a first end and a second end, the first end having a width less than a width of the second end of the aperture;
    providing a buckle base and buckle-fixing pin combination, a buckle base being in a generally U-shaped form, the buckle base including a first leg, a second leg, and a bridge therebetween, the first and second legs connected to the bridge;
    placing the buckle base in the second end of the aperture of the printed circuit board assembly;
    providing the sheet including a hook extending therefrom;
    placing the hook of the sheet into the first end of the aperture of the printed circuit board assembly; and
    inserting a buckle-fixing pin between the hook and the buckle base into the aperture of the printed circuit board assembly.

13. The method of claim 12, wherein the aperture of the printed circuit board assembly is in the form of a bottle.

14. The method of claim 12, wherein the sheet is metal.

15. The method of claim 12, wherein each of the first and second legs of the buckle base has an interior surface and an exterior surface, each of the interior surfaces of the first and second legs including a knob extending therefrom.

16. The method of claim 12, wherein the buckle-fixing pin forms a longitudinal slot that widens at an end thereof.

17. The method of claim 12, wherein the buckle base and the buckle-fixing pin are separate components.

18. The method of claim 12, wherein the buckle base and the buckle-fixing pin are connected by a tether.

19. The method of claim 12, wherein the buckle base and the buckle-fixing pin are pivotably connected.

20. The method of claim 12, wherein the buckle base and the buckle-fixing pin comprise polymeric materials.

* * * * *